(12) United States Patent
Chen

(10) Patent No.: US 11,927,871 B2
(45) Date of Patent: Mar. 12, 2024

(54) NEAR-EYE DISPLAYING METHOD CAPABLE OF MULTIPLE DEPTHS OF FIELD IMAGING

(71) Applicant: HES IP HOLDINGS, LLC, Spring, TX (US)

(72) Inventor: Tai-Kuo Chen, New Taipei (CN)

(73) Assignee: HES IP HOLDINGS, LLC, Spring, TX (US)

(*) Notice: Subject to any disclaimer, the term of this patent is extended or adjusted under 35 U.S.C. 154(b) by 840 days.

(21) Appl. No.: 16/976,506

(22) PCT Filed: Mar. 1, 2018

(86) PCT No.: PCT/CN2018/077715
§ 371 (c)(1),
(2) Date: Aug. 28, 2020

(87) PCT Pub. No.: WO2019/165620
PCT Pub. Date: Sep. 6, 2019

(65) Prior Publication Data
US 2021/0003900 A1 Jan. 7, 2021

(51) Int. Cl.
*G02B 27/00* (2006.01)
*G02B 27/01* (2006.01)
(Continued)

(52) U.S. Cl.
CPC ........... *G02F 1/29* (2013.01); *G02B 27/0172* (2013.01); *G02B 27/30* (2013.01); *H01L 25/167* (2013.01);
(Continued)

(58) Field of Classification Search
CPC ........ G02B 27/30; G02B 27/01; G02B 27/00; G02B 27/10; G02B 27/0075
See application file for complete search history.

(56) References Cited

U.S. PATENT DOCUMENTS 6,961,993 B2  11/2005  Oohata
8,866,184 B2  10/2014  Yamagata et al.
(Continued)

FOREIGN PATENT DOCUMENTS

CN  102629667 A  8/2012
CN  103792826 A  5/2014
(Continued)

OTHER PUBLICATIONS

Taiwan Office Action issued in TW107106033 dated Mar. 21, 2019.
(Continued)

*Primary Examiner* — Joseph P Martinez
(74) *Attorney, Agent, or Firm* — Chen Yoshimura LLP

(57) ABSTRACT

Disclosed are near-eye displaying methods and systems capable of multiple depths of field imaging. The method comprises two steps. At a first step, one or more pixels of a self-emissive display emit a light to a collimator such that the light passing through the collimator is collimated to form a collimated light. At a second step, the self-emissive display provides at least one collimated light direction altering unit on a path of the light from the collimator to change direction of the collimated light to enable the collimated light from at least two pixels to intersect and focus at a different location so as to vary a depth of field.

10 Claims, 11 Drawing Sheets

(51) Int. Cl.
  *G02B 27/30* (2006.01)
  *G02F 1/29* (2006.01)
  *H01L 25/16* (2023.01)
  *H01L 33/58* (2010.01)
  *H10K 50/858* (2023.01)
  *H10K 59/35* (2023.01)
  *H10K 59/12* (2023.01)

(52) U.S. Cl.
  CPC .......... *H01L 33/58* (2013.01); *H10K 50/858* (2023.02); *H10K 59/353* (2023.02); *G02B 2027/0127* (2013.01); *G02F 1/294* (2021.01); *G02F 2203/12* (2013.01); *G02F 2203/24* (2013.01); *G02F 2203/28* (2013.01); *H10K 59/12* (2023.02)

(56) References Cited

U.S. PATENT DOCUMENTS

| | | | |
|---|---|---|---|
| 9,860,522 | B2 | 1/2018 | Lapstun |
| 9,906,781 | B2 | 2/2018 | Fujimaki |
| 9,964,767 | B2 | 5/2018 | Son et al. |
| 10,429,650 | B2 | 10/2019 | Tsai et al. |
| 10,663,735 | B2 | 5/2020 | Tsai et al. |
| 2002/0064032 | A1 | 5/2002 | Oohata |
| 2005/0067944 | A1 | 3/2005 | Masuda et al. |
| 2013/0285885 | A1 | 10/2013 | Nowatzyk et al. |
| 2014/0056003 | A1 | 2/2014 | Frattalone et al. |
| 2014/0183515 | A1 | 7/2014 | Yamagata et al. |
| 2016/0219272 | A1 | 7/2016 | Fujimaki |
| 2017/0082263 | A1 | 3/2017 | Byrnes et al. |
| 2017/0111635 | A1 | 4/2017 | Miyazaki et al. |
| 2017/0219828 | A1 | 8/2017 | Tsai et al. |
| 2017/0255011 | A1 | 9/2017 | Son et al. |
| 2017/0269358 | A9 | 9/2017 | Luebke et al. |
| 2018/0031842 | A1 | 2/2018 | Cai et al. |
| 2018/0067456 | A1 | 3/2018 | Zhang et al. |
| 2018/0247922 | A1 | 8/2018 | Robin et al. |
| 2019/0018244 | A1* | 1/2019 | Tan ................... G02F 1/29 |
| 2019/0361243 | A1 | 11/2019 | Tsai et al. |

FOREIGN PATENT DOCUMENTS

| | | |
|---|---|---|
| CN | 103885582 A | 6/2014 |
| CN | 104246578 A | 12/2014 |
| CN | 102629667 B | 3/2015 |
| CN | 105008983 A | 10/2015 |
| CN | 105449125 A | 3/2016 |
| CN | 105739094 A | 7/2016 |
| CN | 105911791 A | 8/2016 |
| CN | 106057843 A | 10/2016 |
| CN | 106292240 A | 1/2017 |
| CN | 106526864 A | 3/2017 |
| CN | 106873161 A | 6/2017 |
| CN | 107015361 A | 8/2017 |
| CN | 107490862 A | 12/2017 |
| CN | 107561697 A | 1/2018 |
| CN | 107561702 A | 1/2018 |
| CN | 107664840 A | 2/2018 |
| CN | 108431666 A | 8/2018 |
| CN | 105449125 B | 11/2018 |
| CN | 106932916 A | 7/2021 |
| EP | 3423885 A1 | 1/2019 |
| JP | H05142511 A | 6/1993 |
| JP | H11234705 A | 8/1999 |
| JP | 2002090704 A | 3/2002 |
| JP | 2002118124 A | 4/2002 |
| JP | 2007147718 A | 6/2007 |
| JP | 2011145607 A | 7/2011 |
| JP | 2015521298 A | 7/2015 |
| JP | 2016020929 A | 2/2016 |
| JP | 2007027157 A | 2/2017 |
| JP | 2017529557 A | 10/2017 |
| JP | 2017538959 A | 12/2017 |
| TW | 509969 B | 11/2002 |
| TW | 201416717 A | 5/2014 |
| TW | 201510573 A | 3/2015 |
| TW | I607243 B | 12/2017 |
| TW | 201805688 A | 2/2018 |
| WO | 2015170080 A1 | 11/2015 |
| WO | 2016163231 A1 | 10/2016 |
| WO | 2017089676 A1 | 6/2017 |
| WO | 2017151199 A1 | 9/2017 |
| WO | 2018001321 A1 | 1/2018 |
| WO | 2018013307 A1 | 1/2018 |
| WO | 2018126677 A1 | 7/2018 |
| WO | 2019166018 A1 | 9/2019 |

OTHER PUBLICATIONS

Taiwan Office Action issued in TW107106033 dated Sep. 17, 2019.
International Preliminary Report on Patentability dated Jun. 10, 2020 in International Patent Application No. PCT/CN2018/077715, filed on Mar. 1, 2018 with English translation of International Preliminary Report.
International Search Report and Written Opinion dated Dec. 6, 2018 in International Patent Application No. PCT/CN2018/077715, filed on Mar. 1, 2018 with English translation of International Search Report, 2 pages.
Office Action of Japan counterpart application dated Jan. 11, 2022.
European Search Report issued in EP 19760179.2 dated Mar. 23, 2021.
European Search Report issued in EP 18907507.0 dated Sep. 24, 2021.
Supplementary European Search Report, dated Jun. 13, 2022 in corresponding application EP 19760179.2.
Supplementary European Search Report, dated Nov. 7, 2022 in corresponding application EP 18907507.0.
Taiwanese Office Action, dated Sep. 7, 2022, in a counterpart Taiwanese patent application, No. TW 108106943.
Chinese Office Action, dated Feb. 16, 2023 in a counterpart Chinese patent application, No. CN 201880090627.7.
International Search Report and Written Opinion dated May 29 2019 in International Patent Application No. PCT/CN2019/076752, filed on Mar. 1, 2019 with English translation of International Search Report, 2 pages.
Office action issued in a corresponding U.S. Appl. No. 16/976,526 dated Aug. 28, 2023.

* cited by examiner

NEAR-EYE DISPLAYING METHOD CAPABLE OF MULTIPLE DEPTHS OF FIELD IMAGING

FIELD OF THE INVENTION

The present invention is related to a near-eye displaying method capable of multiple depths of field imaging; more particularly, a near-eye displaying method capable of making light emitted by any two pixels to intersect and create foci at different locations so that the output image has multiple depths of field.

BACKGROUND OF THE INVENTION

As the demand for real-time information rises, the importance of on-demand data transmission is also increased. Near-eye displays (NED) are often portable, and can be easily incorporated into other devices and can transmit images, colors, texts and/or sound data at any time; therefore, it is a primary choice for portable information device or on-demand data transmission purposes. Near-eye displays are often implemented for military or governmental uses in the past. Currently, the near-eye display industry seeks expansion in the consumer sector. Meanwhile, the entertainment industry also sees the market potential in near-eye displays; for example, home entertainment system and gaming software developers have been putting effort into research and development of near-eye displays.

Currently, a typical near-eye display includes head-mounted display (HMD), which can project image directly into users' eyes. This type of display can emulate bigger displays to overcome the shortcomings of the displays in mobile devices. The head-mounted display can also be applied to virtual reality or augmented reality uses.

Near-eye displays can be further categorized into two types: immersive display and see-through display. In virtual reality (VR) environment, an immersive display can be implemented to enable composite images to completely cover the visual field of a user. In augmented reality (AR) environment, a see-through display is implemented; and therefore, texts, side notes or images can be overlapped with real images. In the field of augmented reality display technology, a transparent panel (implemented via optical or electro-optical means) is often used in a see-through display. This enables the user of the near-eye display to see both virtual images and real images in the same time.

However, since human eyes cannot focus on objects placed at a very close distance (for example, when a user is wearing glasses and using a magnify lens as a reading aid, a distance within the range of the magnify lens and the glasses is considered "close distance"); therefore, the near-eye display needs to be calibrated and adjusted to avoid image being out of focus so as to provide a comfortable using experience for the users. The traditional near-eye displays rely on complex and heavy optical assembly to adjust the focus of the image; however, since near-eye display is usually worn on the user's head, heavier near-eye displays oftentimes cannot be accepted by the users.

To overcome the above mentioned shortcomings, if one can enable at least two light beams emitted by at least two separate pixels to intersect and focus to produce a clear image, heavy optical assembly would no longer be necessary; furthermore, the manufacturing cost arisen from the optical assembly would be eliminated.

SUMMARY OF THE INVENTION

The present invention provides a near-eye displaying method capable of multiple depths of field imaging, which reduces manufacturing cost and increases displaying efficiency. The present invention allows lights emitted by any two pixels to intersect and create foci at different locations so that the output image has multiple depths of field.

To achieve the aforementioned purpose, the present invention discloses a near-eye displaying method capable of multiple depths of field imaging, characterized in that the method comprises the steps of:

one or more pixels of a self-emissive display emitting a light to a collimator such that the light passing through the collimator is collimated to form a collimated light; and providing at least one collimated light direction altering unit on a path of the light from the collimator to change direction of the collimated light to enable the collimated light from at least two pixels to intersect and focus at a different location causing change in the depth of field.

In some embodiments of the present invention, the self-emissive display comprises an active light source including an organic light-emitting diode, a micro light emitting diode, a quantum dot light emitter or a laser.

In some embodiments of the present invention, the self-emissive display is a transparent display or a non-transparent display.

In some embodiments of the present invention, the collimator is a microlens, a flat metalens or a liquid crystal spatial light modulator.

In some embodiments of the present invention, the flat metalens has the function of a diopter lens for collimating a direction of the light.

In some embodiments of the present invention, the liquid crystal spatial light modulator comprises a plurality of liquid crystal cells, an alignment of a liquid crystal within the liquid crystal cells can be changed by altering a driving voltage applied to the liquid crystal cells so that a direction of an incident light from every pixel is collimated.

In some embodiments of the present invention, the collimated light direction altering unit is a microlens, a flat metalens, or a liquid crystal spatial light modulator.

In some embodiments of the present invention, the microlens enables at least two collimated lights to intersect and focus.

In some embodiments of the present invention, the flat metalens comprises a plurality of areas having bumps for enabling at least two collimated lights to intersect and focus.

In some embodiments of the present invention, two different areas having bumps are utilized to enable at least two collimated lights to intersect and focus at different locations to create an image having multiple depths of field.

In some embodiments of the present invention, an area having bumps is utilized to enable at least two collimated lights to intersect and focus at different locations to create an image having multiple depths of field.

In some embodiments of the present invention, the liquid crystal spatial light modulator comprises a plurality of liquid crystal cells, an alignment of a liquid crystal in the liquid crystal cells can be changed by altering a driving voltage applied to the liquid crystal cells so as to manipulate a direction of the collimated light and enable at least two collimated lights to intersect and focus.

In some embodiments of the present invention, a driving voltage of at least two liquid crystal cells can be changed to enable at least two collimated lights to intersect and focus at different locations to create an image having multiple depths of field.

In some embodiments of the present invention, a driving voltage of at least one liquid crystal cell can be changed to enable at least two collimated lights to intersect and focus at different locations to create an image having multiple depths of field.

In some embodiments of the present invention, the pixel is a single pixel or a collection of pixels comprising a plurality of pixels.

The near-eye displaying method capable of multiple depths of field imaging according to the present invention has the following advantages over the prior art:

1. The present invention enables light emitted by two or more pixels to intersect at different locations to create foci so that the output image exhibits the effect of having multiple depths of field. The aforementioned pixel is a single pixel or a collection of pixels comprising a plurality of pixels.
2. The liquid crystal spatial light modulator according to the present invention can directly adjust the direction of the collimated light; thus, it does not require moving the position of the pixel to create foci at different locations using light emitted by two pixels; that is to say, light emitted by two pixel can intersect at different locations and create different foci. The cost arisen from using redundant optical elements can be eliminated.

DETAILED DESCRIPTION OF THE PREFERRED EMBODIMENTS

Embodiments of the present invention will now be described, by way of example only, with reference to the accompanying drawings.

Figure 1:
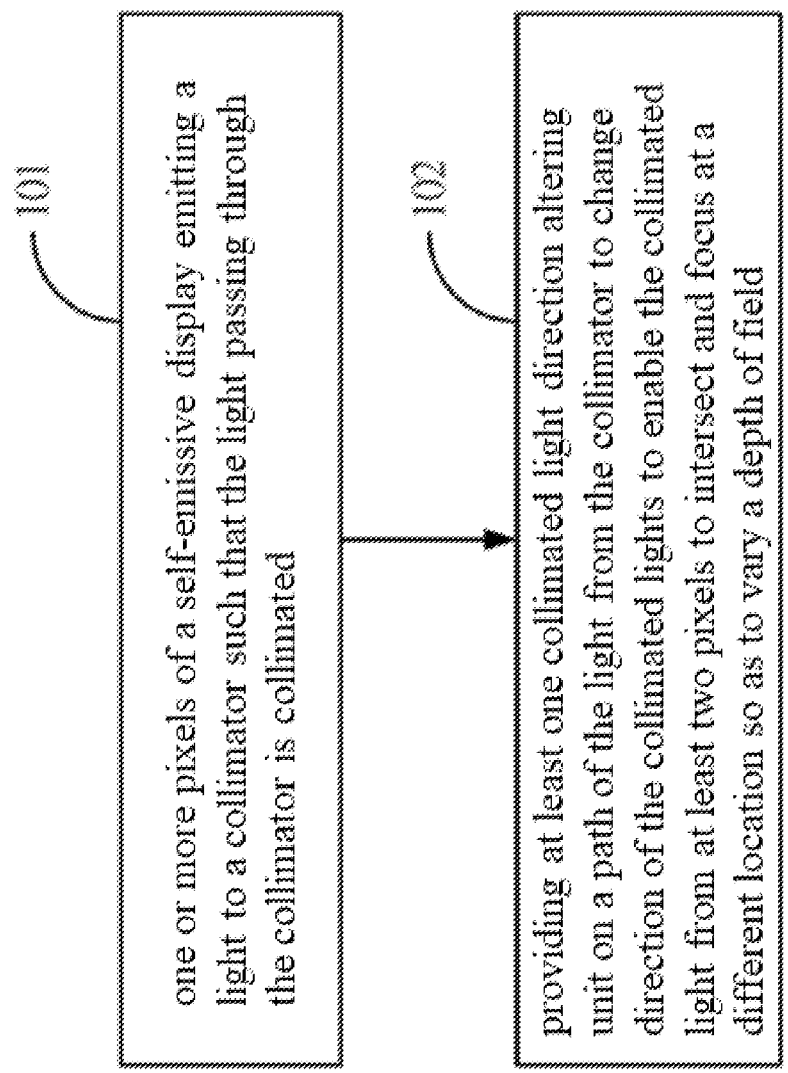
FIG. 1 is a flow schematic diagram of the near-eye displaying method capable of multiple depths of field imaging according to the present invention.

FIG. 1 is a flow diagram of a near-eye displaying method capable of multiple depths of field imaging according to the present invention; the method comprises the steps of:

Step 101: one or more pixels of a self-emissive display emitting a light to a collimator such that the light passing through the collimator is collimated; and Step 102: providing at least one collimated light direction altering unit on a path of the light from the collimator to change direction of the collimated lights to enable the collimated light from at least two pixels to intersect and focus at a different location so as to vary a depth of field.

According to the aforementioned method, a self-emissive display 1 utilized technology that enables self-emission; and the self-emissive display 1 may be a transparent display or a non-transparent display. The self-emissive display 1 may comprise active light sources such as organic light-emitting diodes (OLED), micro light emitting diodes (micro LED), quantum dot light emitters, or lasers . . . etc.

Figure 2A:
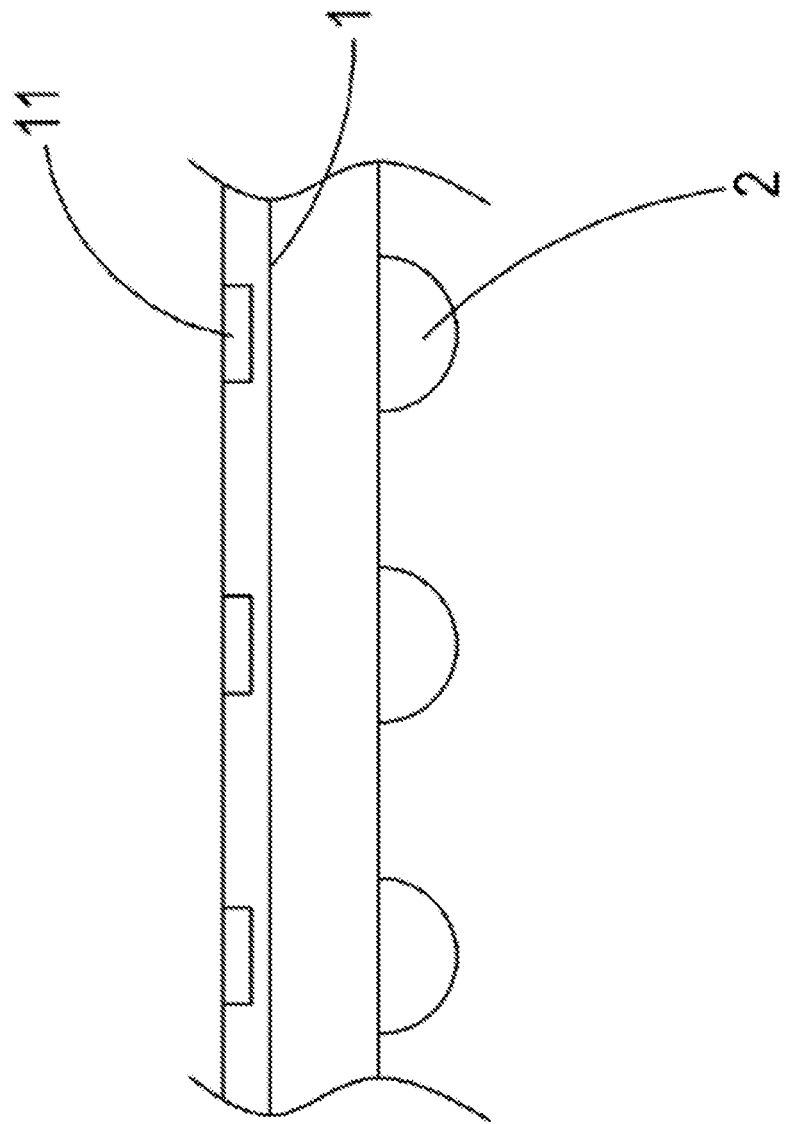
FIG. 2A is an architectural schematic diagram of the near-eye displaying method capable of multiple depths of field imaging according to the first embodiment of the present invention.
Figure 2B:
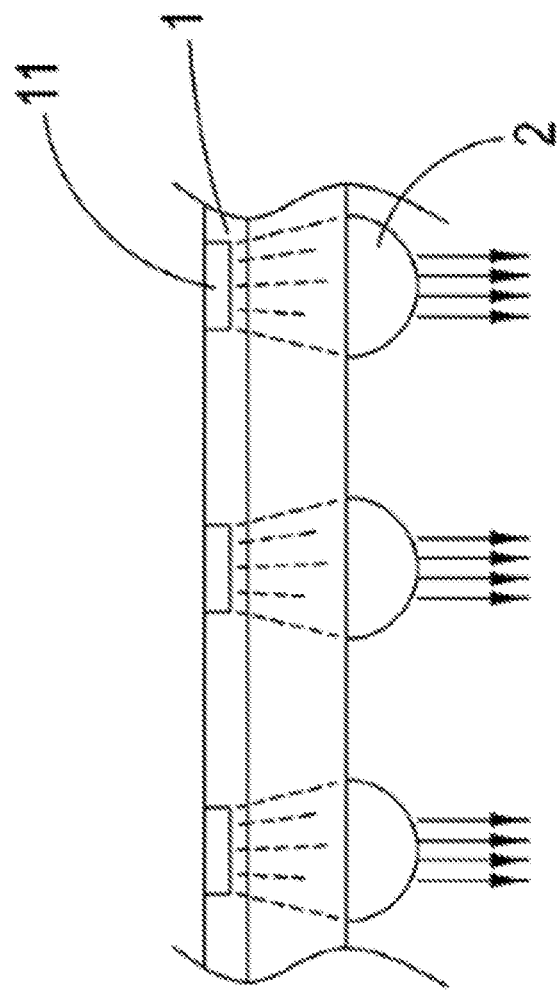
FIG. 2B is a schematic diagram of the near-eye displaying method capable of multiple depths of field imaging according to the first embodiment of the present invention.

The collimator may be a microlens, a liquid crystal spatial light modulator (LCSLM) or a flat metalens. The following further explains the different types of collimators:

(1) Microlens: As shown in FIG. 2A, a microlens 2 is on a light path of a light emitted by the self-emissive display 1. During operation, as shown in FIG. 2B, a direction of an incident light from at least one pixel 11 of the self-emissive display 1 is collimated.

Figure 3A:
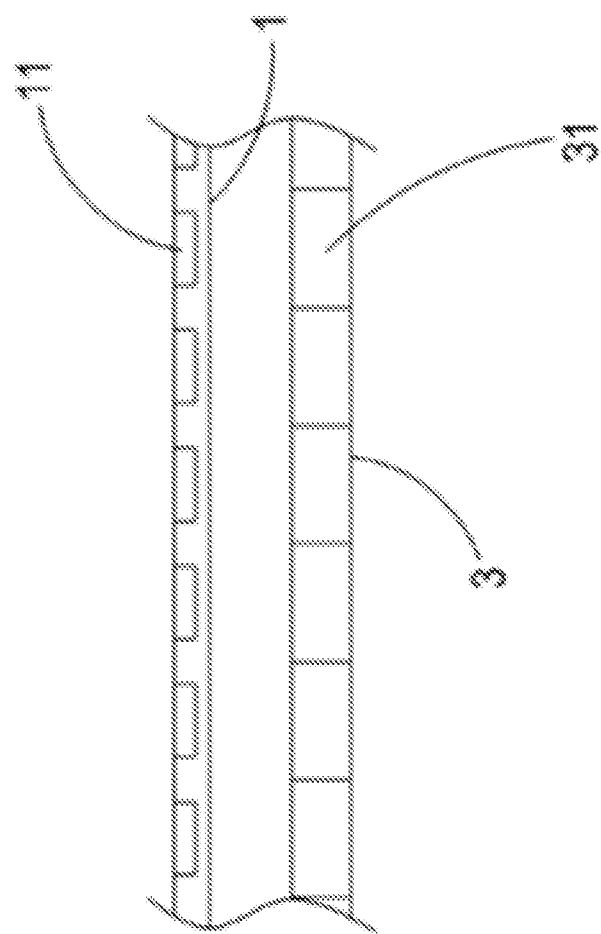
FIG. 3A is an architectural schematic diagram of the near-eye displaying method capable of multiple depths of field imaging according to the second embodiment of the present invention.
Figure 3B:
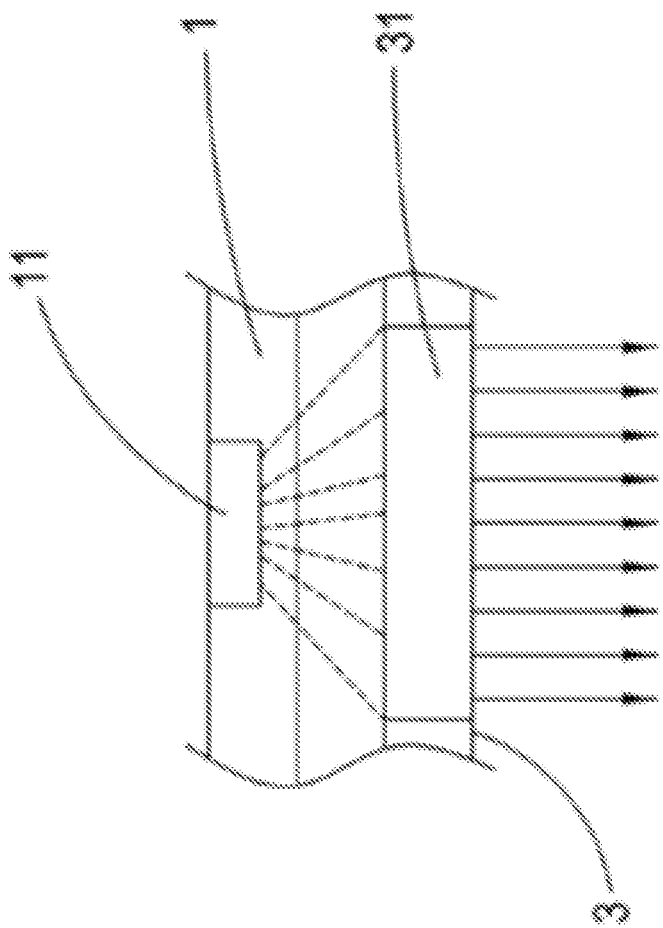
FIG. 3B is a schematic diagram of the near-eye displaying method capable of multiple depths of field imaging according to the second embodiment of the present invention.

(2) Liquid Crystal Spatial Light Modulator (LCSLM): As shown in FIG. 3A, a liquid crystal spatial light modulator 3 comprises a plurality of liquid crystal cells 31; when at least one pixel 11 on the self-emissive display 1 emits an incident light, as shown in FIG. 3B, a driving voltage of one of the liquid crystal cells 31 receiving the incident light of the at least one pixel 11 can be changed so that the incident light from the at least one pixel 11 is collimated (the known technology of changing the driving voltage of the liquid crystal cell 31 to alter the phase of the liquid crystal is omitted herein).

Figure 4A:
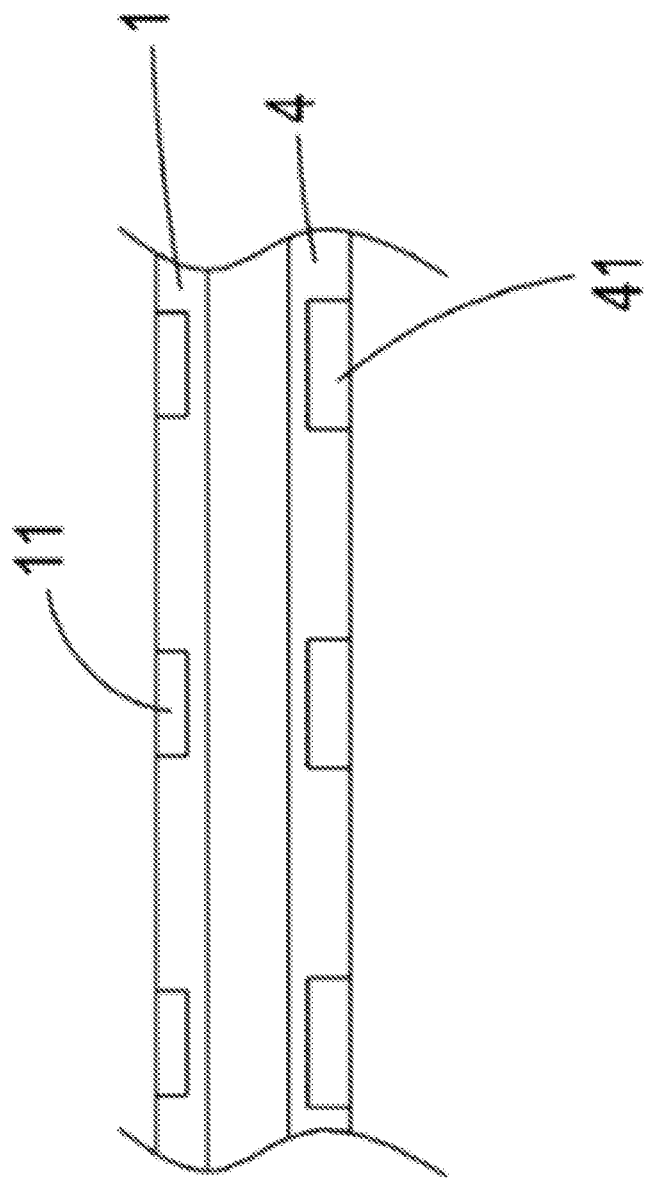
FIG. 4A is an architectural schematic diagram of the near-eye displaying method capable of multiple depths of field imaging according to the third embodiment of the present invention.
Figure 4B:
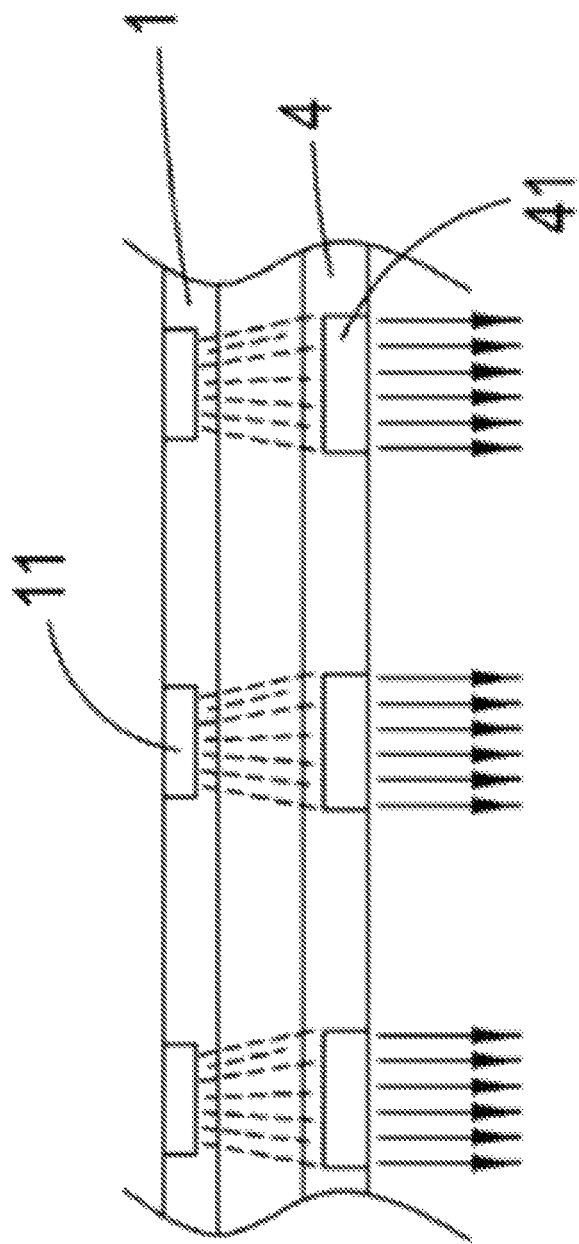
FIG. 4B is a schematic diagram of the near-eye displaying method capable of multiple depths of field imaging according to the third embodiment of the present invention.

(3) Flat Metalens: As shown in FIG. 4A, a flat metalens 4 comprises a plurality of areas 41 having bumps; during operation, as shown in FIG. 4B, an incident light from one of the pixels 11 can be collimated by one of the areas 41 (the fact that the flat metalens 4 can affect light to travel at a different direction is well known in the art; and thus, further explanation is omitted herein). The flat metalens described herein is a metasurface containing nano-bumps which serves the function of refracting light and changing the direction of the collimated light.

The collimated light direction altering unit is a microlens, a liquid crystal spatial light modulator (LCSLM) or a flat metalens. The following further explains the different types of collimated light direction altering units:

(1) Microlens:

A. The structure of the microlens 2 is shown in FIG. 2A; the microlens 2 is utilized to allow at least two collimated lights to intersect and focus to create a virtual image;

B. Two different microlens 2 are utilized to enable two collimated lights to intersect; another microlens 2 is utilized to enable another collimated light to intersect and focus at a different location to produce an image having multiple depths of field.

(2) Liquid Crystal Spatial Light Modulator (LCSLM):

A. The structure of the liquid crystal spatial light modulator 3 is shown in FIG. 3A. The structure of the liquid crystal spatial light modulator 3 comprises a plurality of liquid crystal cells 31; the operational principle of changing the direction of the collimated light is changing a driving voltage of one of the liquid crystal cells 31 receiving the incident light (the collimated light) of two pixels 11, so that the direction of at least two incident lights (the collimated lights) is changed, causing the at least two incident lights (the collimated lights) to intersect and create a focus of a virtual image;

B. The driving voltage of at least two different liquid crystal cells 31 are changed so that two collimated lights intersect at different locations and create foci to produce an image having multiple depths of field;

C. The driving voltage of a liquid crystal cell 31 remains constant, and the driving voltage of at least another different liquid crystal cell 31 is changed so that two collimated lights intersect at different locations and create foci to produce an image having multiple depths of field.

(3) Flat Metalens:

A. The structure of the flat metalens 4 is shown in FIG. 4A. The flat metalens 4 enables at least two collimated lights to intersect and create focus to produce a virtual image;

B. Two different areas 41 having bumps are utilized to enable two collimated lights to respectively intersect at different locations to create foci to produce an image having multiple depths of field;

C. A different area 41 having bumps is utilized to enable at least two collimated lights to intersect and focus at different locations to create an image having multiple depths of field.

When generating image having multiple depths of field, different combinations of collimators and collimated light direction altering units can be used. The combinations are described as the following:

(1) A microlens is used as a collimator; and a microlens, a liquid crystal spatial light modulator (LCSLM) or a flat metalenses is used as a collimated light direction altering unit.

(2) A liquid crystal spatial light modulator is used as a collimator; and the same liquid crystal spatial light modulator is used as a collimated light direction altering unit.

(3) A flat metalens is used as a collimator; and the same flat metalense is used as a collimated light direction altering unit.

(4) A flat metalense is used as a collimator; and a microlens, a liquid crystal spatial light modulator, or a flat metalens is used as a collimated light direction altering unit.

Figure 5A:
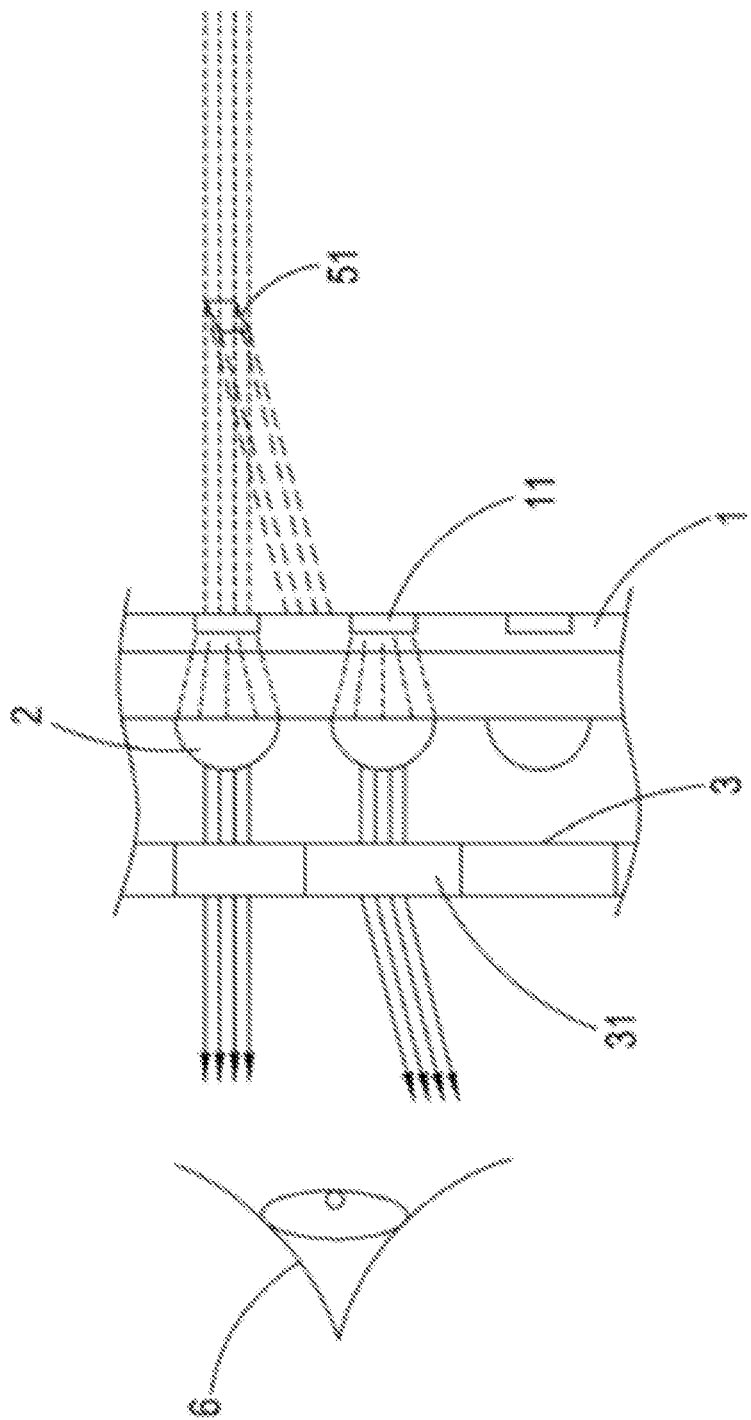
FIG. 5A is a schematic diagram illustrating the concept of multiple depths of field according to the near-eye displaying method capable of multiple depths of field imaging of the present invention.
Figure 5B:
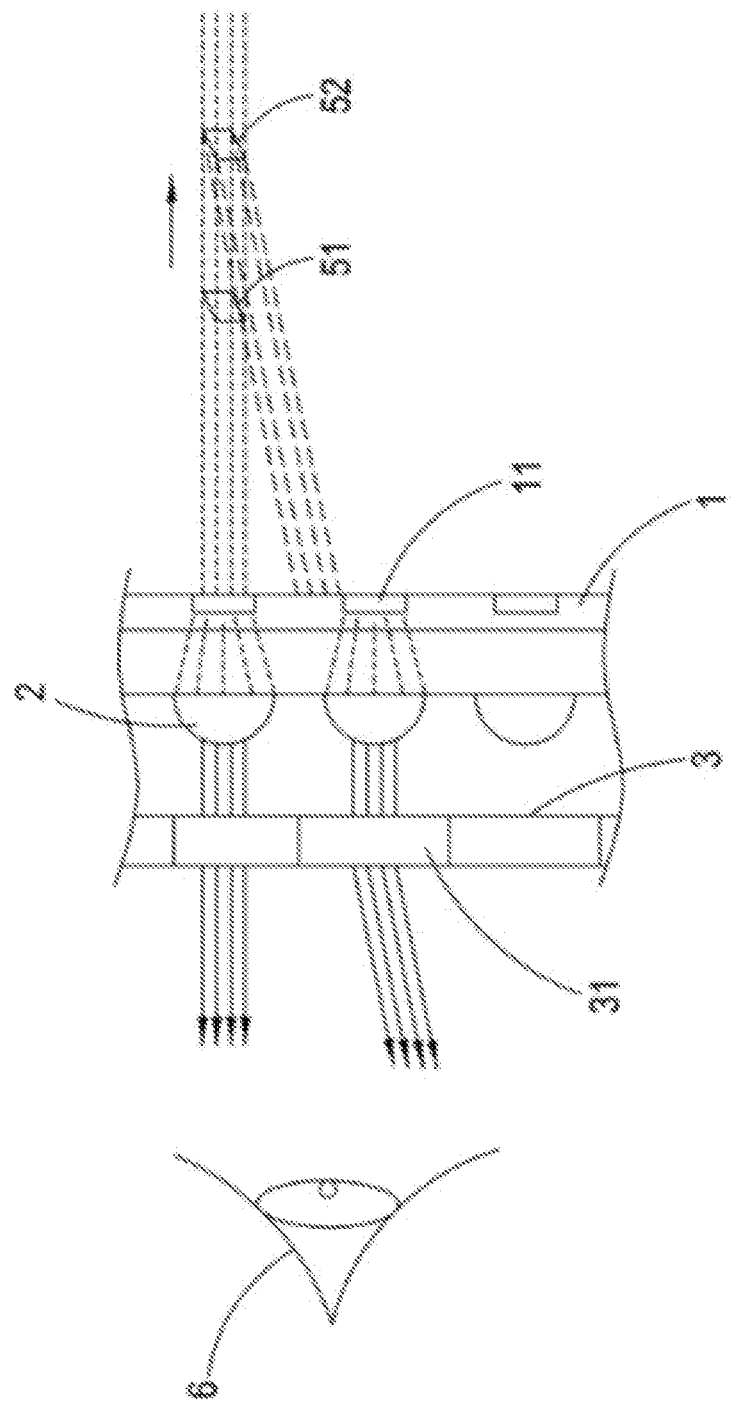
FIG. 5B is another schematic diagram illustrating the concept of multiple depths of field according to the near-eye displaying method capable of multiple depths of field imaging of the present invention.

As shown in FIG. 5A, the collimator is a microlens 2, and the collimated light direction altering unit is a liquid crystal spatial light modulator 3. After the microlenses 2 collimate light from two pixels 11 of the self-emissive display, one of the liquid crystal cells 31 of the liquid crystal spatial light modulator 3 adjusts the direction of light from one or more of the pixels 11, so that lights of two pixels 11 can extend and form a virtual image 51. As shown in FIG. 5B, the phase of one of the liquid crystal cells 31 can be changed to alter the direction of the collimated light such that lights of two pixels 11 can overlap at another location to form another virtual image 52 so as to extend the depth of field. With the aforementioned method, the phase of the liquid crystal cells 31 can be adjusted constantly so that human eyes 6 are able to view multiple continuous virtual images to achieve multiple depths of field imaging.

Figure 6A:
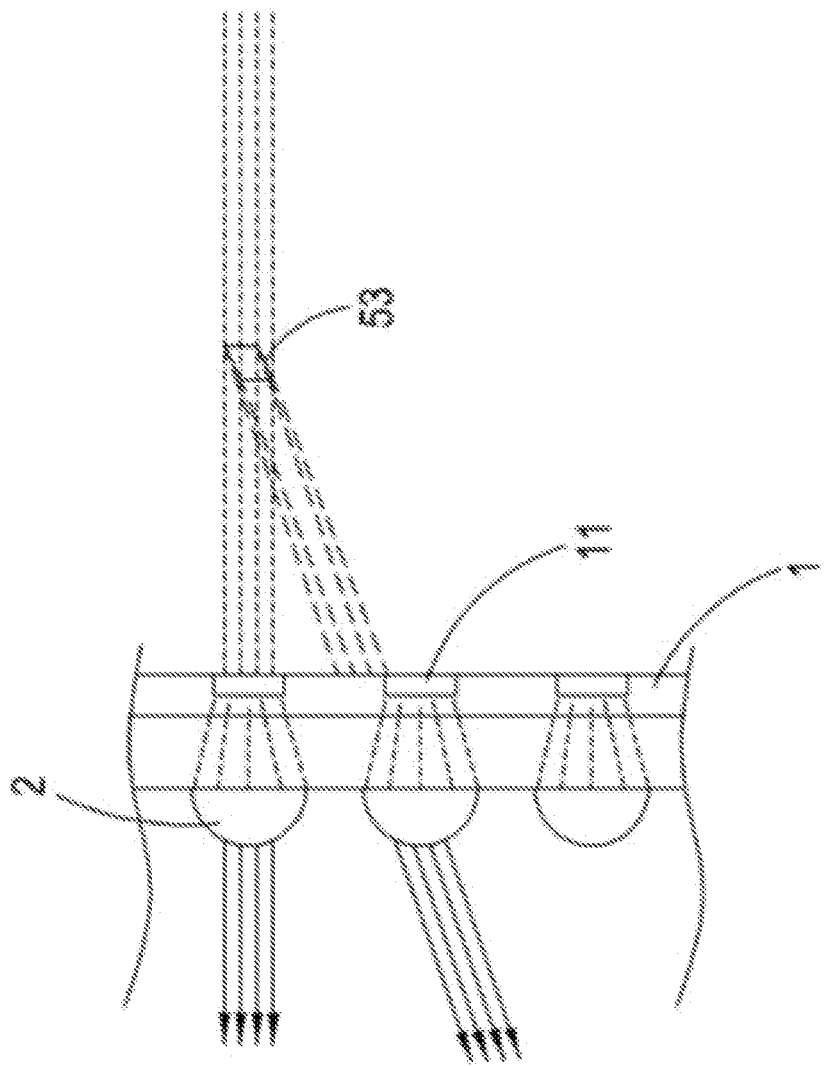
FIG. 6A is a schematic diagram illustrating the concept of multiple depths of field according to another embodiment of the near-eye displaying method capable of multiple depths of field imaging of the present invention.
Figure 6A:
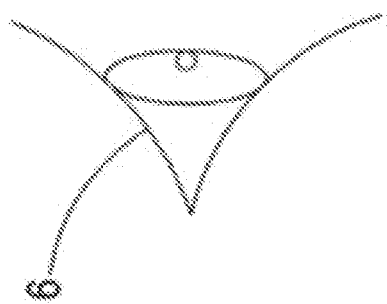
Figure 6B:
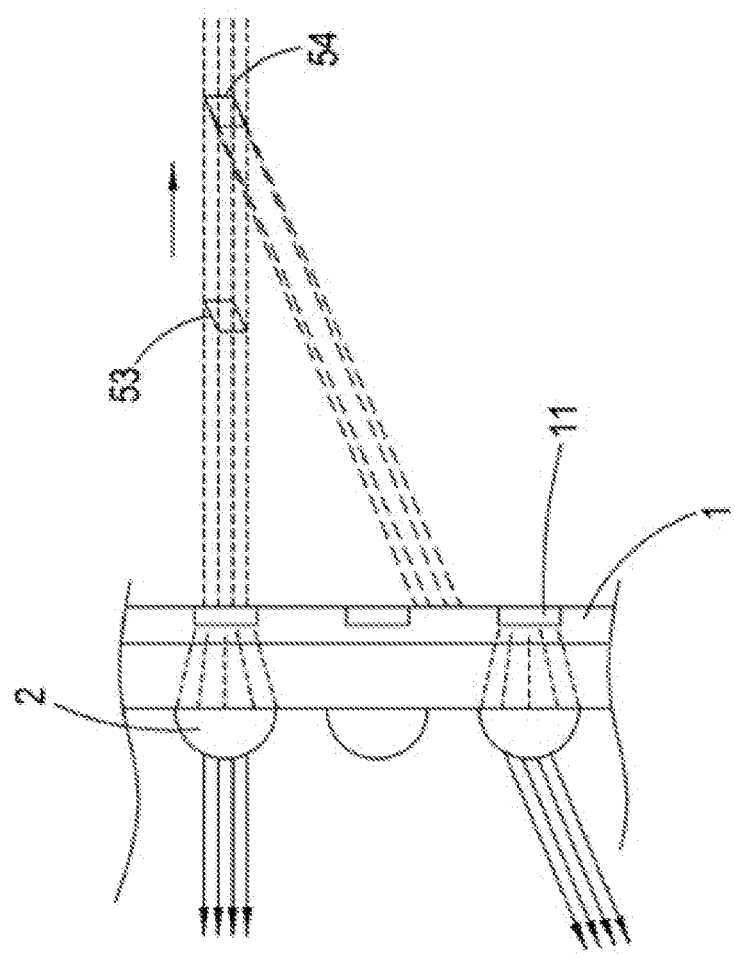
FIG. 6B is another schematic diagram illustrating the concept of multiple depths of field according to another embodiment of the near-eye displaying method capable of multiple depths of field imaging of the present invention.
Figure 6B:
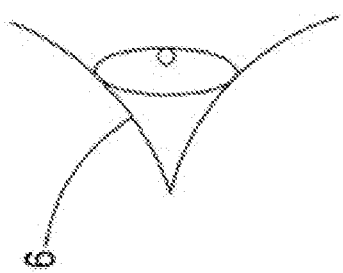

In another aspect of the present invention, a single element can be utilized to collimate and change the direction of the light. The description is as the following:

(1) The microlens 2 can directly collimate light and change the direction of the collimated light. However, the directions at which different microlens can re-direct the collimated light are predetermined according to the manufacturing process of the microlens. Therefore, as shown in FIG. 6A, two separate microlenses 2 cause two collimated lights to intersect and create focus to produce the virtual image 53. However, if forming a focus for another virtual image is needed, then, as shown in FIG. 6B, light from another microlens 2 and the collimated light from the original microlens 2 intersect to create another focus to produce another virtual image 54.

(2) The liquid crystal spatial light modulator 3 or the flat metalens 4 can be used simultaneously to collimate light and adjust the direction of the collimated light, and the driving voltage of the liquid crystal cells 31 of the liquid crystal spatial light modulator 3 can be directly changed to adjust the direction of the collimated light to form foci at different locations for producing a virtual image. However, the flat metalens 4 needs to utilize multiple different areas 41 having bumps to form foci at different locations to produce a virtual image.

The near-eye displaying method capable of multiple depths of field imaging according to the present invention has the following advantages over the prior art:

1. The present invention enables light emitted by two or more pixels to intersect at different locations to create foci so that the output image exhibits the effect of having multiple depths of field. The aforementioned pixel is a single pixel or a collection of pixels comprising a plurality of pixels.

2. The liquid crystal spatial light modulator according to the present invention can directly adjust the direction of the collimated light; thus, it does not require moving the position of the pixel to enable lights emitted by two pixels intersecting and creating foci at different locations. The cost arisen from using redundant optical elements can be eliminated.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A near-eye displaying method capable of multiple depths of field imaging, characterized in that the method comprises the steps of:

one or more pixels of a self-emissive display emitting a light to a collimator such that the light passing through the collimator is collimated to form a collimated light; and providing at least one collimated light direction altering unit on a path of the light from the collimator to change direction of the collimated light to enable the collimated light from at least two pixels to intersect and focus at various depths so as to vary a depth of field continuously, to display multiple virtual images to achieve multiple depths of field imaging, wherein the collimated light direction altering unit is a liquid crystal spatial light modulator.

2. The near-eye displaying method capable of multiple depths of field imaging of claim 1, characterized in that the self-emissive display comprises an active light source including an organic light-emitting diode, a micro light emitting diode, a quantum dot light emitter or a laser.

3. The near-eye displaying method capable of multiple depths of field imaging of claim 1, characterized in that the self-emissive display is a transparent display or a non-transparent display.

4. The near-eye displaying method capable of multiple depths of field imaging of claim 1, characterized in that the collimator is a microlens, a flat metalens or a liquid crystal spatial light modulator.

5. The near-eye displaying method capable of multiple depths of field imaging of claim 4, characterized in that the flat metalens has a function of a diopter lens for collimating a direction of the light.

6. The near-eye displaying method capable of multiple depths of field imaging of claim 4, characterized in that the liquid crystal spatial light modulator comprises a plurality of liquid crystal cells, an alignment of a liquid crystal within the liquid crystal cells can be changed by altering a driving voltage applied to the liquid crystal cells so that a direction of an incident light from every pixel is collimated.

7. The near-eye displaying method capable of multiple depths of field imaging of claim 1, characterized in that the liquid crystal spatial light modulator comprises a plurality of liquid crystal cells, an alignment of a liquid crystal within the liquid crystal cells can be changed by altering a driving voltage applied to the liquid crystal cells so as to change a direction of the collimated light and enable at least two collimated lights to intersect and focus.

8. The near-eye displaying method capable of multiple depths of field imaging of claim 7, characterized in that the driving voltage of at least two liquid crystal cells can be changed to enable at least two collimated lights to intersect and focus at different locations to create an image having multiple depths of field.

9. The near-eye displaying method capable of multiple depths of field imaging of claim 7, characterized in that the driving voltage of at least one liquid crystal cell can be changed to enable at least two collimated lights to intersect and focus at different locations to create an image having multiple depths of field.

10. The near-eye displaying method capable of multiple depths of field imaging of claim 1, characterized in that the pixel is a single pixel or a collection of pixels comprising a plurality of pixels.

* * * * *